United States Patent
Ettorre

(10) Patent No.: US 7,170,432 B2
(45) Date of Patent: Jan. 30, 2007

(54) ADDRESSES GENERATION FOR INTERLEAVERS IN TURBO ENCODERS AND DECODERS

(75) Inventor: Donato Ettorre, Turin (IT)

(73) Assignee: Telecom Italia S.p.A., Milan (IT)

( * ) Notice: Subject to any disclaimer, the term of this patent is extended or adjusted under 35 U.S.C. 154(b) by 0 days.

(21) Appl. No.: 10/538,898

(22) PCT Filed: Dec. 16, 2002

(86) PCT No.: PCT/EP02/14320

§ 371 (c)(1),
(2), (4) Date: Jun. 14, 2005

(87) PCT Pub. No.: WO2004/055992

PCT Pub. Date: Jul. 1, 2004

(65) Prior Publication Data

US 2006/0109158 A1    May 25, 2006

(51) Int. Cl.
*H03M 7/00* (2006.01)
(52) U.S. Cl. .......................................... 341/81; 341/50
(58) Field of Classification Search .......... 341/50–100
See application file for complete search history.

(56) References Cited

U.S. PATENT DOCUMENTS

| | | | | |
|---|---|---|---|---|
| 4,677,625 A | * | 6/1987 | Betts et al. | 341/81 |
| 5,056,105 A | * | 10/1991 | Darmon et al. | 341/81 |
| 5,117,495 A | * | 5/1992 | Liu | 707/7 |
| 5,508,748 A | * | 4/1996 | Krishnamurthy et al. | 341/56 |
| 2002/0124221 A1 | | 9/2002 | Goldman | |

FOREIGN PATENT DOCUMENTS

| | | |
|---|---|---|
| EP | 1 195 910 A2 | 4/2002 |
| WO | WO 02/069504 A2 | 9/2002 |

OTHER PUBLICATIONS

Gutab, A., "A Modulo Multiplication Hardware Design," Oregon State University-Electrical & Computer Engineering Department-ECE 575 Project Report, pp. 1-8 (2000), no month.
Specification 3GPP TS 25.212, V3.5.0, (Dec. 2000), 2 pages, Release 1999, no month.
Masera et al., "Low-Cost IP-Blocks for UMTS Turbo Decoders", Proceedings of ESSCIRC, 4 pages, (Sep. 2001).
Crozier et al., "High-Performance Low-Memory Interleaver Banks for Turbo-Codes", Proceedings of IEEE 54th, vol. 1, pp. 2394-2398, (Oct. 7, 2001).

* cited by examiner

*Primary Examiner*—Rexford Barnie
*Assistant Examiner*—Lam T. Mai
(74) *Attorney, Agent, or Firm*—Finnegan, Henderson, Farabow, Garrett & Dunner, L.L.P.

(57) ABSTRACT

An arrangement for generating addresses for interleaving/de-interleaving sequences $(X_1, X_2, X_3, \ldots, X_K)$ including a given number (K) of items, wherein each value for said given number (K) identifies a corresponding set of interleaving parameters (R, C, p, v). The arrangement has at least one memory unit wherein a plurality of records are stored, each record being indicative of a respective set of parameters (R, C, p, v) corresponding to at least one value for said given number (K). Sets of interleaving parameters (R, C, p, v) are thus available in the memory unit to be promptly and directly retrieved for all possible values of said given number of items (K). A preferred use is in turbo encoders/decoders for advanced telecommunications applications such as UMTS.

18 Claims, 2 Drawing Sheets

ADDRESSES GENERATION FOR INTERLEAVERS IN TURBO ENCODERS AND DECODERS

CROSS REFERENCE TO RELATED APPLICATION

This application is a national phase application based on PCT/EP2002/014320, filed Dec. 16, 2002, the content of which is incorporated herein by reference.

FIELD OF THE INVENTION

The present invention relates to techniques for generating addresses and was developed by paying specific attention to the possible application in interleaving/de-interleaving modules.

A preferred application of the present invention is in third generation mobile communication systems, and more to the point in the implementation of the turbo decoder mother interleaver described in the technical Specification 3GPP TS 25.212 V3.5.0. (2000–12) Release 1999.

DESCRIPTION OF THE PRIOR ART

A turbo encoder is a component used in telecommunication systems with the purpose of re-arranging the information to be transmitted, with the possible addition of control codes, in such a way that the effect of impairment sources adversely affecting transmission can be compensated by means of complementary decoding at the decoder.

Exemplary of telecommunication systems adapted for employing turbo encoding/decoding schemes are systems adopting the so-called Universal Mobile Telecommunications System (UMTS) standard.

Key elements in turbo encoders/decoders (as defined e.g. in the 3GPP TS 25.212 Specification) are the so-called interleaver/de-interleaver blocks. Operation of such a block essentially provides for the order of the elementary items of information (bits) included in a given block of length K to be changed according to a predetermined law.

In EP-A-1 195 910 an interleaver is disclosed for use in a turbo encoder for UMTS apparatus. The interleaver in question includes a register for updating and registering a plurality of parameters for setting an operating condition of the interleaver; a controller for generating a control signal for controlling an operation of the system by receiving the operating condition from the register; an address calculator for generating a finally interleaved address using an inter row permutation pattern, an intra row permutation pattern increment arrangement value and an intra row permutation basic sequence, provided by the register according to the control signal generated by the controller; and a data storage for sequentially storing data input to the turbo encoder and outputting data corresponding to the address generated by the address calculator.

Such an arrangement is thus based on an interleaver that includes a register for updating and registering a plurality of interleaving parameters (i.e. the number K of input data items, and those parameters designated R, C, p, µ and TypeD) for setting an operating condition of the interleaver. This prior art device is therefore based on the assumption that these parameters are generated and obtained from outside the device.

Therefore, such prior art document fails to teach how to implement an interleaver wherein the interleaving parameters can be dynamically and rapidly adapted, e.g. to take into account possible variations in the number K of input data items, which may in fact vary even with each packet being transmitted.

In "*Low-Cost IP-blocks for UMTS turbo decoders*" by Masera, Mazza, Piccinini, Viglione, Zamboni—*Proceedings of ESSCIRC* 2001, Villach, September 2001 an arrangement is disclosed for implementing in hardware form some of the elements comprising an interleaver. Also this prior art document fails to provide directions useful in implementing an interleaver whose parameters can be dynamically and rapidly adapted and, more generally, an arrangement where the interleaving parameters can be directly and dynamically extracted from the information to be transmitted (essentially the value of k).

OBJECTS AND SUMMARY OF THE PRESENT INVENTION

The object of the present invention is thus to provide an address generation arrangement for use in interleavers/de-interleavers wherein the interleaving parameters can be directly and dynamically extracted from the information to be transmitted, thus permitting those parameters to be dynamically and rapidly adapted e.g. to possible variations in the number K of input data items to be interleaved/de-interleaved.

According to the present invention, such an object is achieved by means of an address generating system having the features specifically called for in the claims that follow. The invention also relates to a corresponding method of operation as well as to a turbo encoder/decoder including the address generating arrangement of the invention as a part of an interleaver/de-interleaver block. Finally the inventions relates to a computer program product directly loadable in the internal memory of a digital computer (such as e.g. a processor), the product including software code portions for performing the method of the invention when the product is run on a digital computer.

A preferred embodiment of the invention is an arrangement for generating addresses for interleaving/de-interleaving sequences including a given number (K) of items (e.g. in turbo encoders/decoders), the arrangement including at least one memory unit with a plurality of records stored therein. Each record includes information signals indicative of a respective set of interleaving parameters corresponding to at least one value for the given number of data items (K).

Still preferably, each value for the given number of data items (K) identifies a corresponding set of parameters (R, C, p, v) for constructing a matrix (R×C) for arranging said the input sequence and effecting intra-row and inter-row permutation of the matrix to generate a permuted matrix for generating the output addresses. Sets of said parameters (R, C, p, v) are thus promptly available for all possible values of the given number of data items (K).

The value of the given number of items (K) to be interleaved/de-interleaved is usually comprised in a given range of values, and the memory unit preferably includes a number of records that is substantially smaller than said given range of values. Each record in the memory unit is identified by a respective pointer. Associated with the memory unit there is a pointer retrieval circuit configured for generating for each value of the given number of data items in said given range a corresponding pointer pointing to a respective record in the memory unit.

An embodiment of the invention permits a core for the generation of the interleaving addresses to be implemented both as a software solution with a low computational effort (using a commercial DSP or Micro Controller), and—preferably—as an ASIC solution. This important feature leads to a stand-alone solution in the design of a turbo decoder processor used in the UMTS receivers.

BRIEF DESCRIPTION OF THE ENCLOSED DRAWINGS

The invention will now be described, by way of example only, by referring to the enclosed drawings, wherein.

DETAILED DESCRIPTION OF A PREFERRED EMBODIMENT OF THE INVENTION

Figure 1:
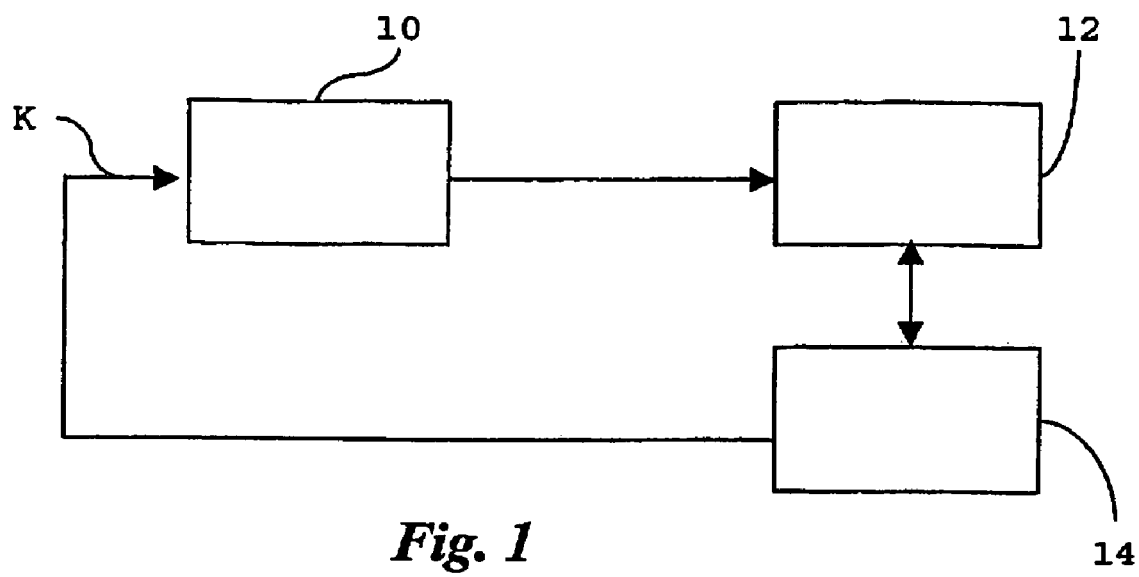
FIG. 1 is a general block diagram showing an interleaver implementation.

By way of introduction to the description of an exemplary embodiment of the invention, the basic principles of operation of a turbo code internal interleaver as provided in the specification 3GPP TS 25.212 V3.5.0. (2002–12) Release 1999 will now be briefly recalled.

Essentially, the turbo code internal interleaver consists of bits-input to a rectangular matrix with padding, intra-row and inter-row permutations of a rectangular matrix, and bits-output from the rectangular matrix with pruning.

The bits input to the turbo code internal interleaver are denoted by $x_1, x_2, x_3, \ldots, x_K$, where K is the integer number of the bits (data items) to be interleaved and takes one value of $40 \leq K \leq 5114$.

The relationship between the bits input to the turbo code internal interleaver and the bits input to the channel coding is defined by $x_k = O_{trk}$ and $K = K_i$. Specifically, the following notations are used:

K Number of bits input to turbo code internal interleaver
R Number of rows of rectangular matrix
C Number of columns of rectangular matrix
p Prime number
v Primitive root
$<s(j)>_{j \in \{0,1, \ldots, p-2\}}$ Base sequence for intra-row permutation
$q_i$ Minimum prime integers
$r_i$ Permuted prime integers
$<T(i)>_{i \in \{0,1, \ldots, R-1\}}$ Inter-row permutation pattern
$<U_i(j)>_{j \in \{0,1, \ldots, C-1\}}$ Intra-row permutation pattern of i-th row
i Index of row number of rectangular matrix
j Index of column number of rectangular matrix
k Index of bit sequence As a first step, the bit sequence $x_1, x_2, x_3, \ldots, x_K$ input to the turbo code internal interleaver is written into the rectangular matrix by assigning to R the values 5, 10 and 20 depending on the value of K. The rows of rectangular matrix are numbered 0, 1, R−1 from top to bottom.

A second step involves determining the prime number to be used in the intra-permutation, p, and the number of columns of rectangular matrix, C. This is done as a function of K and R The columns of the rectangular matrix are numbered 0, 1, . . . , C−1 from left to right.

A third step involves writing the input bit sequence $x_1, x_2, x_3, \ldots, x_K$ into the R×C rectangular matrix row by row starting with bit $y_1$ in column 0 of row 0 where $y_k = x_k$ for k=1, 2, K and if R×C>K, the dummy bits are padded such that $y_k = 0$ or 1 for k=K+1, K+2, . . . , R×C.

These dummy bits are pruned away from the output of the rectangular matrix after intra-row and inter-row permutations.

After the bits-input to the R×C rectangular matrix, the intra-row and inter-row permutations for the R×C rectangular matrix are performed stepwise by using a six-step algorithm detailed in the Specification.

After intra-row and inter-row permutations, the bits of the permuted rectangular matrix are denoted by $y'_k$. The output of the turbo code internal interleaver is the bit sequence read out column by column from the intra-row and inter-row permuted R×C rectangular matrix starting with bit $y'_1$ in row 0 of column 0 and ending with bit $y'_{CR}$ in row R−1 of column C−1.

The output is pruned by deleting dummy bits that were padded to the input of the rectangular matrix before intra-row and inter row permutations, i.e. bits $y'_k$ that corresponds to bits $y_k$ with k>K are removed from the output.

The bits output from turbo code internal interleaver are denoted by $x'_1, x'_2, \ldots, x'_K$, where $x'_1$ corresponds to the bit $y'_k$ with smallest index k after pruning, $x'_2$ to the bit $y'_k$ with second smallest index k after pruning, and so on.

The number of bits output from the turbo code internal interleaver is K and the total number of pruned bits is R×C−K.

All of the foregoing corresponds to processing criteria that are well known to those of skill in the art and, and such do not require to be further detailed herein.

Essentially, the interleaving solution described in the technical Specification 3GPP TS 25.212 V3.5.0. (2000-12) is comprised of three basic steps, namely:

constructing a matrix and inputting the incoming data to the matrix;

intra-row and inter-row permutations;

reading of the permutated data from the matrix obtained via intra-row and inter-row permutations.

The interleaver can be implemented using a data memory in which the incoming data are written sequentially and read in a specific order.

In fact, any interleaving/de-interleaving process can be simply regarded as the result of either of the following operations:

a) taking from an input file the items (e.g. the bits) to be interleaved/de-interleaved in the order they appear in such input file and re-arranging them in an output file at respective positions each identified by a given address;

b) taking the items from an input file in a sequence identified by respective addresses and re-arranging them in an output file one after another as they are taken from the input file.

Also, it will be appreciated that carrying out both operations indicated in the foregoing one after the other (in any order), corresponds to a full interleaving/de-interleaving process.

Hereinafter, reference to an interleaving process will be made for the sake of simplicity, being otherwise understood that what is being stated in connection with interleaving applies directly also to de-interleaving.

An interleaver module as well as a de-interleaver module can be easily implemented by resorting to the processing architecture corresponding to either solution.

This has been schematically depicted in FIG. 1, where reference numeral 10 denotes an address generator having an associated data memory 12 intended to co-operate with a turbo encoder/decoder (codec) 14.

The codec 14 is intended to process (in a known manner, that does not require to be described in detail herein) data arranged in blocks, each block being comprised of K items to be interleaved/de-interleaved.

The information related to the value of K (which, as indicated, may change with each different data packet transmitted/received) is sent from the codec 14 to the address generator 10.

The data memory 12 is the basic element for performing the interleaving/de-interleaving operation.

For instance this may occur by causing the codec 14 to write the data into the memory 12 in a sequential order and then read the data from the memory 12 according to an address sequence defined by the address generator 10. Alternatively, the codec 14 may be caused to write the data into the memory 12 according to an address sequence defined by the address generator 10 and then read the data from the memory 12 in a sequential order.

The address generator 10 described herein is essentially comprised of three units, namely:

a parameter generator 10a, a permutation pattern generator 10b, and an address generator 10c.

Figure 2:
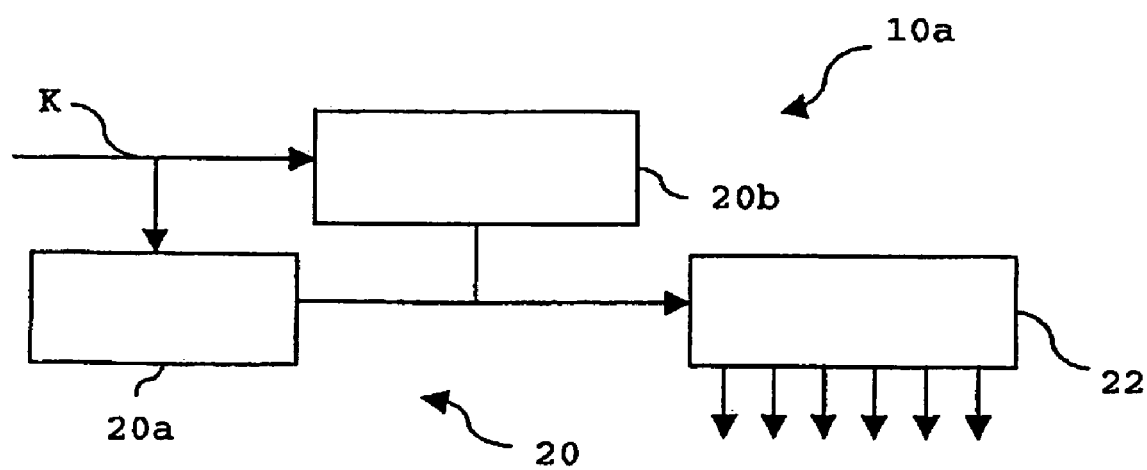
FIG. 2 is a block diagram showing a first step of parameter generation in an embodiment of the invention.
Figure 3:
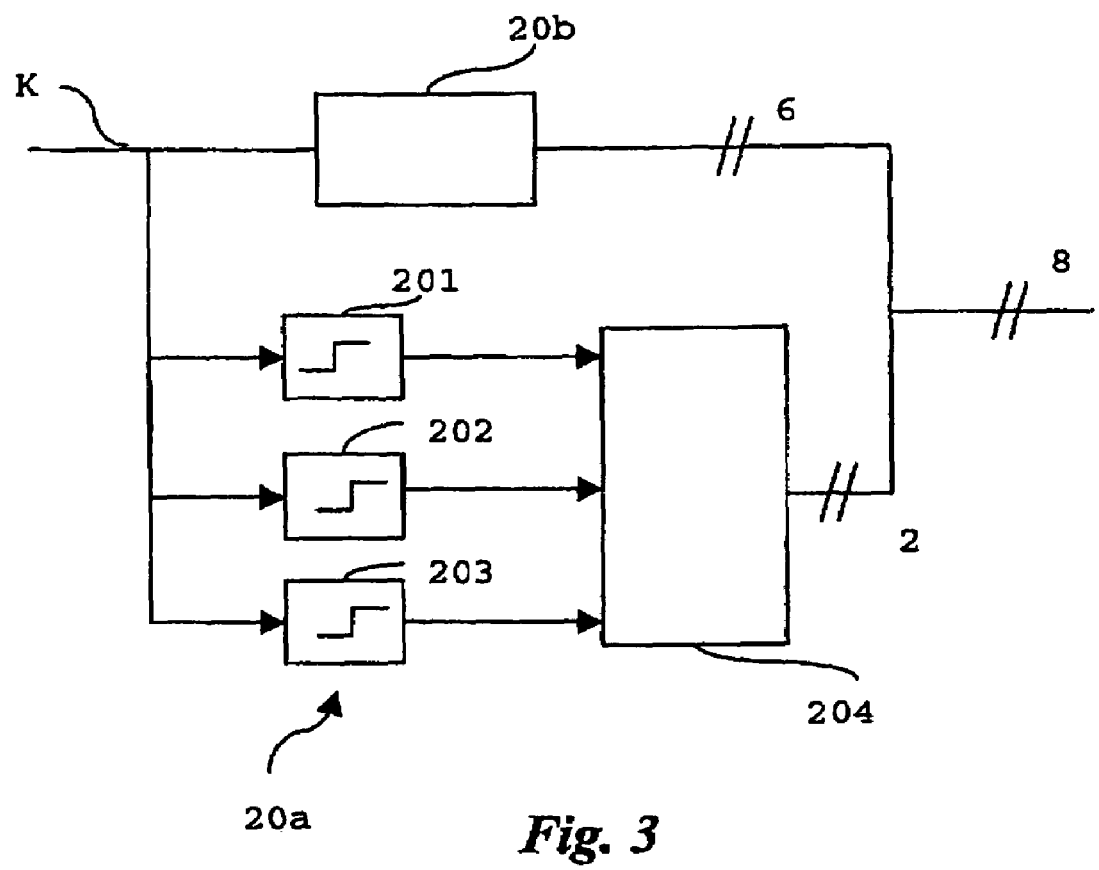
FIG. 3 illustrates in greater detail the block diagram of FIG. 3.

A possible general layout of a parameter generator 10a for use in the arrangement disclosed herein is shown in FIG. 2.

The layout shown is based on the recognition that the computational effort required for the generation of the parameters (R, C, p, v) needed for the construction of the interleaving matrix and the permutation patterns could be reduced if a look-up table (LUT) approach can be used.

Stated otherwise, instead of positively generating (i.e. computing) such parameters whenever a new value of K is encountered (e.g. because the length—given by K—of the data blocks to be interleaved is changed), one could contemplate the possibility of calculating those parameters—once for all—for all possible values of K. Such parameters could then be definitely stored in a memory to be selectively retrieved whenever a new value for K is to be managed.

Such a solution will entail the significant advantage of permitting the address generator to be implemented essentially in hardware form, without the need of providing any specific computing software to be run for each new value for K.

This will inter alia reduce processing time and thus represent a significant advantage as the interleaving process is already by itself relatively time consuming: the whole block of data to be interleaved is in fact to be made available before the interleaving process proper is started since the last input data to the process could be the first output data therefrom.

In the look-up table arrangement considered, the input to the look-up table would then be the size of the data block incoming in the turbo encoder (K). This may change in the range [40, 5114], that is assuming 5075 possible different values. The concatenation of mappings of different parameters (C, R, p, v) could comprise the output of the look-up table. The implementation of this look-up table could be a memory of 5075 records, each record including a respective set of parameters for each possible value of K.

However advantageous, such a solution would not be quite efficient in view of the memory size required, and would inevitably penalize chip area occupation parameters that are critical e.g. for mobile applications such as UMTS mobile terminals.

Implementing the reference algorithm described in the technical Specification 3GPP TS 25.212 V3.5.0, shows that, even if the possible values of K are 5075, the number of different records in the memory is much smaller than 5075, and in practice equal to about 200.

As a result of this, a presently preferred embodiment of the arrangement shown herein provides for the memory comprising the look-up table considered in the foregoing being split in two different memories or memory areas, namely:

a first memory area 20 essentially including storage locations for pointers addressed by the K value;

a second memory area 22 including (second) records for respective, different interleaving parameter sets, each addressed by a pointer.

The number of such (second) records will be smaller than 5075, and in fact limited to about 200 (that is the number of possible different data sets resulting from the implementation of the algorithm defined in the Specification).

The arrangement will thus permit to identify, for each given value of K (5075 possible values), a corresponding pointer to a respective record (i.e. a respective set of interleaving parameters) in the second memory area.

A further step in reducing the memory requirements can be taken by noting that the pointers will end up to be sorted in a growing order in the memory, and thus orderly arranged in groups of adjacent pointers having the same most significant bits (MSB).

This feature can be used to further split the memory area 20 into two sub-units comprised of an MSB (Most Significant Bit) computation circuit 20a and a LSB (Least Significant Bit) pointer memory 20b.

By resorting to that arrangement, a given number of MSBs for the pointers (for instance the first two bits in each pointer) can be determined by comparing the value of K with a number of thresholds in a group of comparators 201, 202, 203 and combining the outcome of these comparisons in a logic unit 204. The remaining, least significant bits (LSBS) can thus be retrieved from the LSB memory 20b, whose size will be correspondingly reduced. For instance, in the case considered of 5075 different values for K, the size of the memory 20b can be reduced from 5075×8 bits to 5075×6 bits since the two MSBs are already determined by the circuit 20a.

By way of example, the thresholds of comparators 201, 202, 203 may be set at values T1, T2 and T3, respectively, with T1 lower than T2 and T2 in turn lower than T3.

The range of possible values for K will thus be partitioned in four portions or bands. T1 will be the upper bound for the first band, while also providing the lower bound for the second band, such second band lying between T1 and T2. The third band will lie between T2 and T3, while T3 will also represent the lower bound for the fourth portion or band.

Comparing the instant value of K against the thresholds T1, T2 and T3 in comparators 201 to 203 and processing the results of the respective comparisons in circuit 204 will therefore lead to locating K in one of those four bands and generating values 00, 01, 10 and 11, respectively, for the two MSBs of the corresponding pointer.

The pointer retrieval arrangement disclosed is thus comprised of:

a circuit 20a sensitive to the given number of items (K) to be interleaved/de-interleaved to derive therefrom the (two) most significant bits of the pointers, and a further memory unit 20b having stored therein the (six) remaining, least significant bits of the pointers.

Of course a lower or a higher number of MSBs can be determined by the circuit 20a, the main aim being reaching the best trade off between memory occupation and combinational logic complexity.

In order to reduce the computational effort required by the subsequent modules included in the interleaver, other information can be stored in the memory locations of the memory 20.

For example a binary flag that is set to "1" when C is equal to p+1 and K is equal to R*C can be useful to generate the output interleaving addresses without any extra complexity. Incidentally, such a binary flag essentially corresponds to the bit designated Type D in EP-A-1 195 910.

Adding such a flag to the records in the memory 22 will generally lead to an increase in the number of such records, in that otherwise identical records may have different values for the flag.

Experiments carried out by the Applicants show however that, even in this case, the number of records in the memory 22 will be slightly in excess of 200, and typically equal to 219 (in comparison to the 5075 different values for K).

Starting from the sets of parameters generated by the module 10a (these are in fact stored as respective records in the memory 22), two kinds of permutation patterns must be computed.

The first one, named vector s, is the intra-row permutation pattern. According to the standard procedure defined in specification 3GPP TS 25.212 V3.5.0, this vector is generated as a pseudo random sequence that uses as the initial seed the value v provided by the earlier stages of processing (that is, in the embodiment shown herein, the first module 10a).

In the arrangement shown herein, the pseudo random sequence (a*b mod c) is generated in module 10b by using a linear algorithm involving no multiplications or divisions. Such an algorithm is known in the area of cryptography as witnessed by the article "A Modulo Multiplication Hardware Design", by Adnan Gutub—Oregon State University—Electrical & Computer Engineering Department—ECE 575 Project Report—Winter 2000.

Moreover, in the standard procedure defined in the specification 3GPP TS 25.212 V3.5.0, in order to have a different permutation for each row, the s vector is addressed by a pseudo random sequence and the seeds of the sequence are different for each row.

Specifically, the algorithm described in the specification includes the generation of a sequence (r sequence) of seeds starting from another sequence (q sequence) of prime numbers.

As opposed thereto, in the arrangement shown herein, the q sequence is directly used without the computation of the r sequence. Simply exchanging the order of the intra-row and inter-row permutations can do this.

This optimisation allows reaching the same results without the inverse permutation described in section 4.2.3.2.3.2-(4) of the 3GPP TS 25.212 V3.5.0. Specification.

For immediate reference this is the operation that requires the sequence $<q_i>_{i \in \{0,1,\ldots,R-1\}}$ to be subjected to permutation to make the sequence $<r_i>_{i \in \{0,1,\ldots,R-1\}}$ such that $$r_{T(i)} = q_i, \; i=0, 1, \ldots, R-1,$$

where $<T(i)>_{i \in \{0,1,\ldots,R-1\}}$ is the inter-row permutation pattern defined as the one of the four kinds of patterns shown in table 3 of 3GPP TS 25.212 V3.5.0. as a function of the number of input bits K.

This approach leads to avoiding an unnecessary reading procedure from a memory (not shown) in which the T values are stored.

The sequence q can be generated by reading a prime numbers table, and a little look up table for the management of the greatest common divisor operation described in section 4.2.3.2.3.2-(3) of the 3GPP TS 25.212 V3.5.0.

Again, for immediate reference, the operation in question assigns $q_0=1$ to be the first prime integer in the sequence $<q_i>_{i \in \{0,1,\ldots,R-1\}}$, and determines the prime integer $q_i$ in the sequence $<q_i>_{i \in \{0,1,\ldots,R-1\}}$ to be a least prime integer such that g.c.d $(q_i, p-1)=1$, $q_i>6$, and $q_i>q_{(i-1)}$ for each $i=1, 2, \ldots, R-1$. Here g.c.d. is greatest common divisor.

Figure 4:
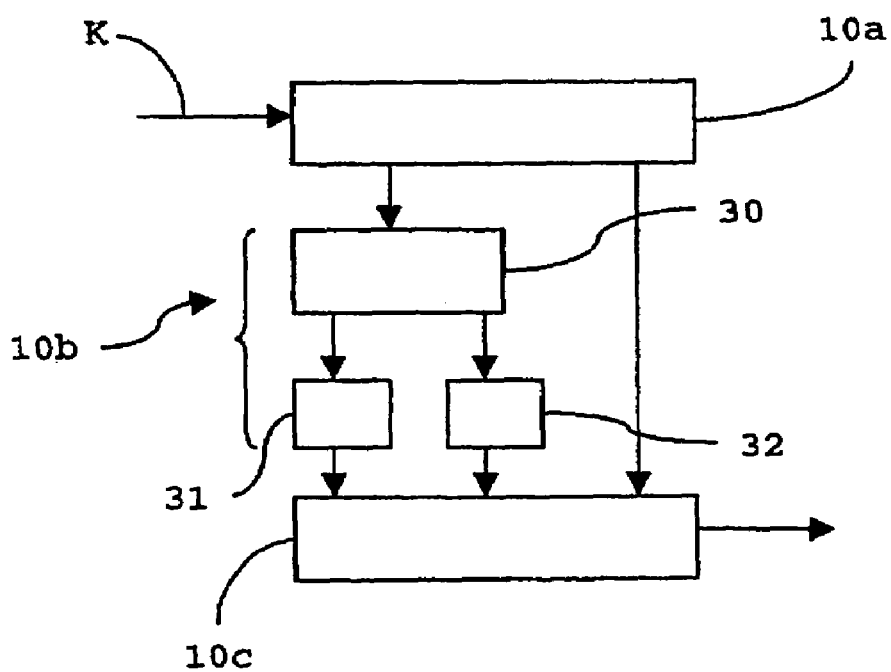
FIG. 4 is a general block diagram of an address generator according to the invention.

Specifically, in the block diagram of FIG. 4, reference numeral 30 designates a block that, starting from the parameters derived from the block 10b, generates the vectors s and q. These vectors are stored in respective memory blocks designated 31 and 32.

Finally, reference 10c designates a block that implements the following relationship:

$$X_r = T(i)$$

$$U_c = s(j*q(i) \bmod (p-1))$$

$$X_c = f(U_c)$$

$$\text{Address\_out} = C*X_r + X_c$$

where s, q, and p are the entities already identified in the foregoing, $X_r$ and $X_c$ are row and column indexes of the matrix before the permutation operations, i and j are the permuted matrix indexes, $U_c$ is the intra-row permutation parameter defined as $(<U_i(j)>_{j \in \{0,1,\ldots,C-1\}}$ in the Specification, and $f$ is a function of $U_c$ which implements algorithm steps as described into section 4.2.3.2.3.2-5 of 3GPP TS25.212 technical specifications.

The output of the block 10c is represented by the interleaving/de-interleaving addresses to be used by the turbo codec 14 (see FIG. 1).

It will be appreciated that the technique described herein for obtaining the interleaving parameters such as R, C, p, V, flag (TypeD) directly from the value K is adapted to be used in conjunction with other arrangements for effecting inter-row and intra-row permutations already know in the art.

Of course, without prejudice to the underlying principle of the invention, the details and embodiments may vary, even significantly, with respect to what has been described by way of example only, without departing from the scope of the invention as defined by the claims that follow.

The invention claimed is:

1. An arrangement for generating addresses for interleaving/de-interleaving sequences including a given number (K) of items, the value of said given number of items (K) being within a given range of possible values, the arrangement comprising:

a first memory unit having stored therein a plurality of records, each record being indicative of a respective set of interleaving/deinterleaving parameters for constructing a matrix for arranging said sequences and for affecting intra-row and inter-row permutation of said matrix to generate a permuted output matrix for generating said addresses, wherein said memory unit has a number of said records stored therein that is less than the number of values in said given range of possible values, and each said record in said memory unit is identified by a respective pointer; and a pointer retrieval circuit associated with said memory unit, said pointer retrieval circuit configured for generating for each value of said given number of items (K) in said given range a corresponding pointer pointing to a respective record in said memory unit.

2. The arrangement of claim 1, wherein said pointer retrieval circuit comprises:
a circuit operating in dependence on said given number of items (K) to derive therefrom a set of most significant bits of said pointers; and
a second memory unit having stored therein the remaining, least significant bits of said pointers.

3. The arrangement of claim 2, wherein said circuit comprises:
a plurality of comparators to compare said given number of items (K) with a number of given thresholds, and
a logic unit for combining the outcome of the comparisons carried out in said comparators and deriving therefrom said set of most significant bits of said pointers.

4. The arrangement of claim 1, wherein said first memory unit comprises, for each said record, at least one flag signal taking one of a first and a second logical value, said flag being set at said second logical value when said given number of items (K) for the corresponding record is equal to the product of the number of rows (R) and the number of columns (C) in said matrix and said number of columns (C) in said matrix equals the value of the parameter (p) used for said intra-row permutation plus 1.

5. The arrangement of claim 1, further comprising arithmetic circuitry exempt from multipliers and dividers for generating a pseudo-random sequence of the type (a*b mod c) for producing a permutation pattern for use in said intra-row permutation.

6. The arrangement of claim 1, further comprising first and second permutation modules for performing said intra-row and said inter-row permutations, said module for performing an inter-row permutation being arranged upstream of said module for performing intra-row permutation.

7. The arrangement of claim 6, comprising an intra-row module for producing a sequence (q) for performing said intra-row permutation, said intra-row module being configured for assigning $q_o=1$ to be the first prime integer in said sequence (q) and determining the prime integer $q_i$ in the sequence to be a least prime integer such that the greatest common divisor (qi, p−1)=1, $q_i>6$, and $q_i>q_{(i-1)}$ for each i=1, 2, . . . , R−1.

8. The arrangement of claim 7, wherein said intra-row module comprises:
a prime numbers table for reading at least the prime integer therefrom; and
a look up table for managing the greatest common divisor operation.

9. A turbo decoder including at least one of an interleaver and a de-interleaver module, said at least one module including an arrangement for generating addresses according to claim 1 or any one of claims 2 to 8.

10. A method of generating addresses for interleaving/de-interleaving sequences including a given number (K) of items, the value of said given number of items (K) being within a given range of possible values, the method comprising the steps of:

generating, on the basis of at least one value of said given number (K) of items, records indicative of a respective set of interleaving/de-interleaving parameters for constructing a matrix for arranging said sequences and affecting intra-row and inter-row permutation of said matrix to generate a permuted output matrix for generating said addresses;
storing in a first memory unit a number of said records that is less than the number of values in said given range of possible values; and
identifying each said record in said memory unit by a respective pointer and generating for each value of said given number of items (K) in said given range a corresponding pointer pointing to a respective record in said memory unit.

11. The method of claim 10, comprising the steps of retrieving said pointers by:
deriving from said given number of items (K) a set of most significant bits of said pointers; and
storing the remaining, least significant bits of said pointers in a second memory unit.

12. The method of claim 11, comprising the steps of:
comparing said given number of items (K) with a number of given thresholds; and
combining the results of comparisons to derive therefrom said set of most significant bits of said pointers.

13. The method of claim 10, comprising the step of storing, for each said record, at least one flag signal taking one of a first and a second logical value, said flag being set at said second logical value when said given number of items (K) for the corresponding record is equal to the product of the number of rows (R) and the number of columns (C) in said matrix and said number of columns (C) in said matrix equals the value of the parameter (p) used for said intra-row permutation plus 1.

14. The method of claim 10, comprising the step of generating a pseudo-random sequence of the type (a*b mod c) for producing a permutation pattern for use in said intra-row permutation, said generating step being carried out by means of a linear algorithm exempt from multiplications and divisions.

15. The method of claim 10, wherein said inter-row permutation is performed before said intra-row permutation.

16. The method of claim 15, comprising the step of producing a sequence (q) for performing said intra-row permutation, said intra-row module being configured for assigning $q_{o=1}$ to be the first prime integer in said sequence (q) and determining the prime integer $q_i$ in the sequence to be a least prime integer such that the greatest common divisor $(q_i, p-1)=1$, $q_{i>}6$, and $q_i>q_{(i-1)}$ for each i=1, 2, . . . , R−1.

17. A turbo encoder including at least one of an interleaver and a de-interleaver module, said at least one module including an arrangement for generating addresses according to claim 1 or any one of claims 2 to 8.

18. A computer-readable medium configured to store instructions for execution by a processor in a digital computer, the instructions including a software code portion for performing the method of claim 10, or any one of claims 11 to 16.

* * * * *